United States Patent
Shih et al.

(10) Patent No.: US 6,535,029 B2
(45) Date of Patent: Mar. 18, 2003

(54) FULLY DIFFERENTIAL CONTINUOUS-TIME CURRENT-MODE HIGH SPEED CMOS COMPARATOR

(75) Inventors: Shou-Po Shih, San Jose, CA (US); Chieh-Yuan Chao, Fremont, CA (US); Yuming Cao, Pleasanton, CA (US); Yu-Jen Wu, Cupertino, CA (US)

(73) Assignee: Silicon Image, Inc., Sunnyvale, CA (US)

(*) Notice: Subject to any disclaimer, the term of this patent is extended or adjusted under 35 U.S.C. 154(b) by 0 days.

(21) Appl. No.: 09/847,837

(22) Filed: May 1, 2001

(65) Prior Publication Data

US 2002/0186052 A1 Dec. 12, 2002

(51) Int. Cl.[7] ................................................ H03K 5/22
(52) U.S. Cl. ......................... 327/65; 327/89; 327/211; 327/212; 327/218
(58) Field of Search ............................. 327/55, 56, 65, 327/66, 67, 68, 69, 70, 89, 218, 208, 209, 210, 211, 212

(56) References Cited

U.S. PATENT DOCUMENTS 4,461,965 A * 7/1984 Chin ............................ 327/55
6,008,673 A * 12/1999 Glass et al. .................. 327/77
6,184,721 B1 * 2/2001 Krymski ...................... 327/52
6,255,875 B1 * 7/2001 Gabara ........................ 327/201

FOREIGN PATENT DOCUMENTS

JP           5-235706      * 9/1993 .................. 327/55

* cited by examiner

Primary Examiner—Tuan T. Lam
(74) Attorney, Agent, or Firm—Girard & Equitz LLP

(57) ABSTRACT

A fully differential continuous-time current-mode high-speed complimentary metal oxide semiconductor comparator is disclosed. The comparator includes an input and an output; a pre-amplifier element coupled to each respective one of the plurality of inverters; an application switch operative to couple the pre-amplifier element to the input of a corresponding one of the plurality of inverters, the application switch having a first duty cycle; a current source operative to provide a bias current; and a bias switch operative to couple the bias current to each of the plurality of inverters, the bias switch having a duty cycle that is complementary to the duty cycle of the application switch, wherein the output of each of the plurality of inverters is pulled to about one-half the maximum output voltage level before a comparison between input signals is performed. By maintaining the comparator output at a substantially predetermined voltage level during non-operating periods, the switching characteristics of the comparator are enhanced.

28 Claims, 5 Drawing Sheets

FULLY DIFFERENTIAL CONTINUOUS-TIME CURRENT-MODE HIGH SPEED CMOS COMPARATOR

FIELD OF THE INVENTION

The present invention generally relates to integrated circuit devices and, more particularly, to a reduced form factor complementary metal oxide semiconductor comparator exhibiting high speed operating characteristics.

BACKGROUND OF THE INVENTION

In presently available digital video display systems, an analog input signal, representing an image is converted into a digital signal for later presentation to a user on a suitable display device (i.e., computer monitor, LCD, flat panel display, etc.). To provide such functionality, the analog input signal is first converted into a digital signal, appropriately filtered, and then the filtered digital signal is transmitted to the display device for presentation to the user.

The transmission of the digital signal from the converting and filtering device(s) to the display device is performed through the use of an interface. In particular, presently available digital display systems employ a digital video interface (DVI) interface which operates, for example, according to the standard promulgated by the Digital Display Working Group (DDWG). The DVI standard requires the use of transition-minimized differential-signaling (TMDS) to transmit graphic and other complementary data from a computing device, which performs the aforementioned conversion and filtering operations, to the display device. TMDS requires the use of a TMDS transmitter and a corresponding TMDS receiver.

The TMDS receiver may include comparison circuitry and other operational components that provide the receiver's functionality. In order to meet the DVI standard, the receiver, in addition to other specifications, must be able to operate at frequencies up to about 1.65 GHz with 3-times oversampling. Consequently, any underlying comparator must also be able to operate at frequencies up to about 1.65 GHz with 3-times over sampling.

SUMMARY OF THE INVENTION

The aforementioned and related drawbacks associated with conventional comparators and their application in digital systems are substantially reduced or eliminated by the present invention. The present invention is directed to a complementary metal oxide semiconductor (CMOS) comparator capable of operating at frequencies of about 5.0 GHz, having a 0.35 $\mu$m form factor layout. Thus, any device employing the comparator of the present invention will be in compliance with, and can be used, in conjunction with the DVI and other digital interfaces.

The comparator of the present invention includes a pair of cross-coupled inverters having a pair of outputs and a pair of input transistors, each having a gate, source and drain, each having a gate for receiving an input voltage signal, and a source and drain. Further included is a means, responsive to a first signal, for connecting together the outputs of the cross-coupled inverters so that the inverter outputs have a nearly equal voltage (about half the supply voltage) and for supplying a bias current to the input transistors so as to charge the drains of the input transistors based on input voltage signals present at the gates of the input transistors, a means, responsive to a second signal, for applying the charged drains of the input transistors to the outputs of the cross-coupled inverters to establish, on the outputs of the cross-coupled inverters, a voltage difference representative of a voltage difference at the inputs and for supplying a source current, from a supply voltage, to the bias current means, and a means for establishing an RC time-constant at the drains of the input transistors. By maintaining the output of the comparator at one-half the maximum output level, the switching characteristics (i.e. the speed in which the inverters provide an output signal) is enhanced as the comparator does not have to be pulled from a low voltage to a high voltage at high frequencies after each comparison. In other words, the comparator does not have to traverse a full voltage swing of the underlying components in order to perform a comparison between the corresponding input signals.

An advantage provided by the present invention is that the comparator can operate at high frequencies.

Another advantage provided by the present invention is that it requires less real estate than conventional comparators.

Yet another advantage provided by the present invention is that it exhibits a small peak-to-peak output voltage swing.

A feature of the present invention is that it operates over a wide input bandwidth range.

BRIEF DESCRIPTION OF THE DRAWINGS

The aforementioned and related advantages and features of the present invention will become apparent upon review of the following detailed description of the invention, taken in conjunction with the following drawings, where like numerals represent like elements, in which.

DETAILED DESCRIPTION OF THE INVENTION

Figure 1:
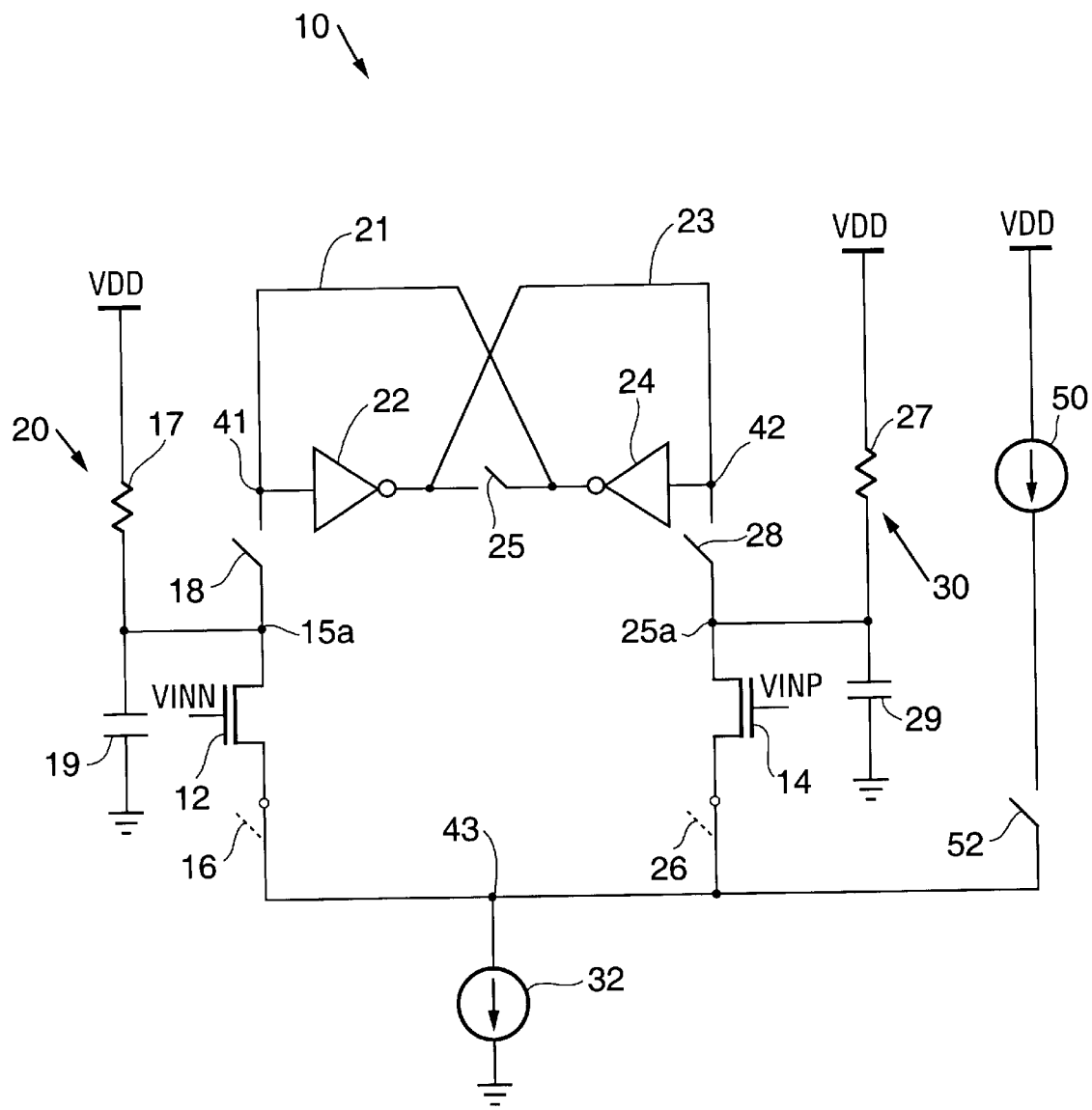
FIG. 1 is a block diagram of the comparator according to a preferred embodiment of the present invention.

The CMOS comparator of the present invention will now be described with reference to FIGS. 1–5. FIG. 1 is a block diagram of the comparator according to an exemplary embodiment of the present invention. As illustrated in FIG. 1, the comparator 10 includes a first inverter 22 and a second inverter 24. The outputs of the respective inverters provide the result of a comparison between a corresponding set of input signals presented at inputs $V_{INN}$ and $V_{INP}$, respectively. As further illustrated in FIG. 1, the input of the first inverter 22 is coupled to node 41. The input of the second inverter 24 is coupled to node 42. The output of the first inverter 22 is coupled to the input of the second inverter 24 at node 42 on line 23, and to one side of a switch 25. The output of the second inverter 24 is coupled to the input of the first inverter 22 at node 41 on line 21, and to the other side of the switch 25. The switch 25 is caused to alternate between an "on" state and an "off" state based on the application of a representative clock signal provided thereto. In addition, the output of the first inverter 22 may also be provided to any suitable device coupled to line 23, as will be discussed below. In corresponding fashion, the output of the second inverter 24 may be provided to any suitable device coupled to line 21.

Figure 2:
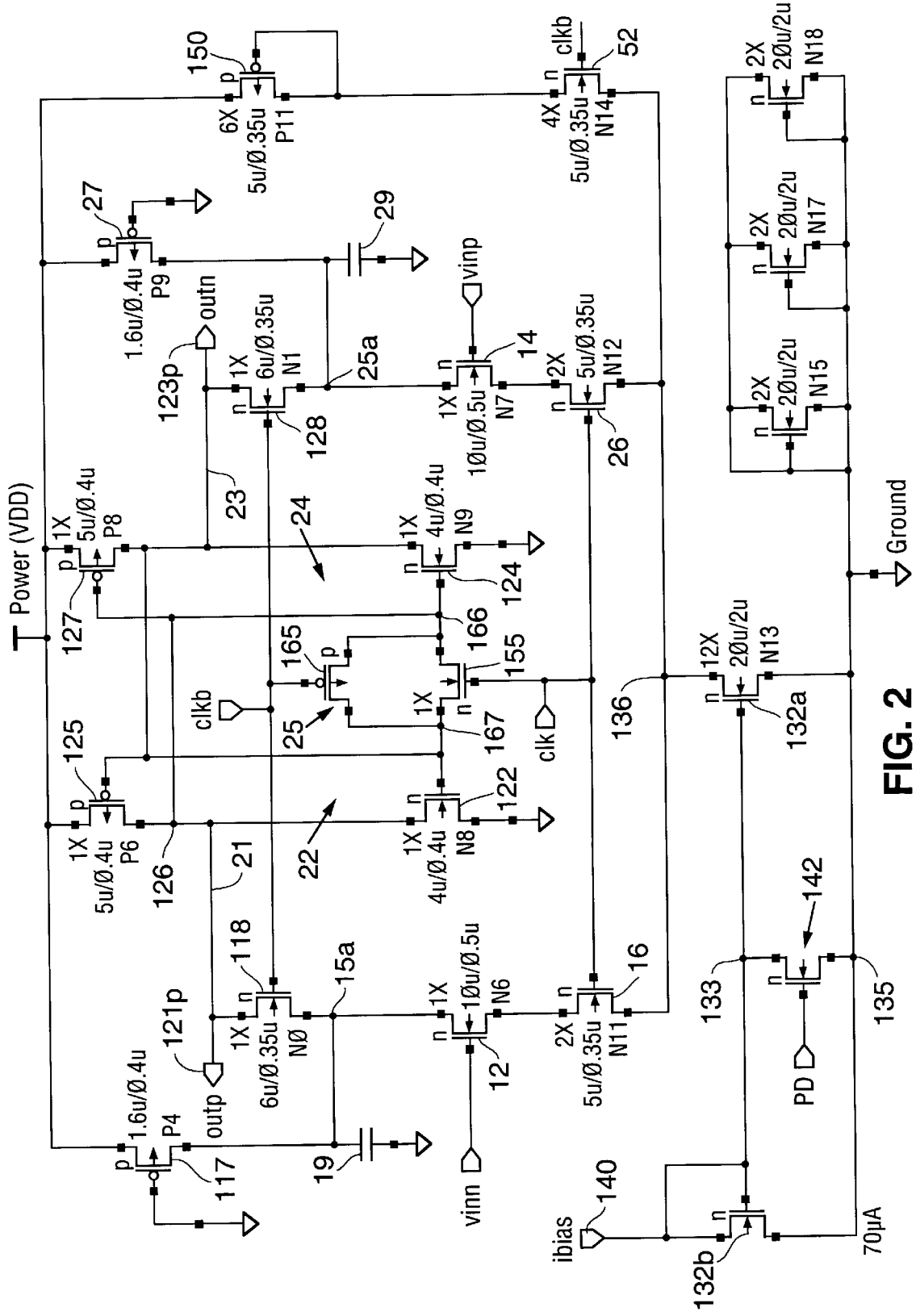
FIG. 2 is a schematic diagram of the comparator illustrated in FIG. 1.

As illustrated in greater detail in FIG. 2, the first inverter 22 is comprised of an n-channel MOSFET 122 having a source, drain and gate and a p-channel MOSFET 125 having a corresponding source, drain and gate. The gates of the n-channel MOSFET 122 and the p-channel MOSFET 125 are connected together. The drain of the n-channel MOSFET 122 is coupled to the drain of the p-channel MOSFET 125 at node 126. Node 126 represents the positive output (i.e. output) of the comparator 10 provided on pin 121p. The source of the n-channel MOSFET 122 is coupled to ground. The source of the p-channel MOSFET 125 is coupled to $V_{DD}$ and the source of a p-channel MOSFET 117, which embodies the resistive element 17 of a first pre-amplifier element 20 (FIG. 1).

The second inverter 24 is comprised of an n-channel MOSFET 124 having a source, drain and gate and a corresponding p-channel MOSFET 127, also having a source, drain and gate. The gates of the n-channel MOSFET 124 and the p-channel MOSFET 127 are connected together. The inter-connected gates of the two MOSFETs are also connected to node 126. The source of the n-channel MOSFET 124 is connected to ground. The drain of the n-channel MOSFET 124 is coupled to the drain of the p-channel MOSFET 127 at node 128. Node 128 is also connected to the inter-connected gates of n-channel MOSFET 122 and p-channel MOSFET 125, which comprise the first inverter 22. The source of the p-channel MOSFET 127 is coupled to $V_{DD}$ along the upper voltage rail of the comparator. Node 128 represents the negative output (outn) of the comparator 10 provided on pin 123p.

Switch 25 is connected the outputs of the inverters 22 and 24, respectively, and is comprised of a parallel connected combination of an n-channel MOSFET 155 and a p-channel MOSFET 165, where the source and drain of the respective MOSFETs are connected to the gates of the corresponding MOSFETs 122, 124, 125 and 128 that comprise the first and second inverters 22 and 24, respectively at nodes 166 and 167. The gate of the n-channel MOSFET 155 is connected to a clock signal (clk). Thus, the switchable "on" and "off" periods of the switch 25 are controlled by the main comparator operating clock (clk).

Referring back to FIG. 1, a first pre-amplifier 20, consisting of a resistive element 17 and a capacitive element 19 is coupled to node 15a. The voltage provided by the first pre-amplifier element 20 is coupled to the input of the first inverter 22 at node 41 via a first application switch 18. In corresponding fashion, a second pre-amplifier element 30, consisting of a resistive element 27 and a capacitive element 29 is coupled to node 25a. The voltage provided by the second pre-amplifier element 30 is coupled to the input of the second inverter 24 at node 42 via a second application switch 28. As the first and second pre-amplifier elements are substantially identical in structure and operation, only first pre-amplifier element 20 will be described hereinafter.

Referring back to FIG. 2, in an exemplary embodiment of the present invention, the resistive element 17 of the first pre-amplifier element 20 is comprised of a p-channel MOSFET 117, having a source, drain and gate. The gate of the MOSFET 117 is connected to ground potential. The drain of the MOSFET 117 is coupled to ground through the parasitic capacitance (represented as capacitor 19) and the gate-to-drain capacitance ($C_{gd}$) of the MOSFET 117. In an alternate embodiment, a suitable capacitor may be used in addition to the $C_{gd}$ of the transistor to ensure proper capacitive load. With the MOSFET 117 having such a configuration, it effectively functions as a resistor. In addition, by using this configuration for the resistive element 17, the RC constant, which directly corresponds to the charge/discharge rate of the nodes 15a and 25a of the comparator 10, is maintained at a very small level; thereby, allowing the nodes 15a and 25a to be charged and discharged very quickly. Based on testing, it has been determined that the comparator 10 of the present invention can operate as switching frequencies as high as about 5.0 GHz. As a result, the comparator 10 is able to operate at higher switching frequencies than conventional comparators. This becomes very important when transmitting constantly varying signals between components, such as occurs in digital video systems.

In addition to minimizing the RC time constant (i.e. switching time) of the inverters, the channel length and width of the transistors (i.e. MOSFETs) that comprise the inverters 22 and 24 has also been reduced. In an exemplary embodiment of the present invention, the channel length of transistors 122, 124, 125 and 128 is 0.4 μm. The channel width of transistors 122 and 124 is 4 μm. The channel width of transistors 125 and 128 is 5 μm. Reducing the channel length and width increases the drain-to-source current of the transistors, while at the same time reducing the gate-to-source ($C_{gs}$) and gate-to-drain ($C_{gd}$) capacitance of the transistors; thereby, resulting in a faster charge/discharge process.

As further illustrated in FIG. 2, the first application switch is 18 comprised of an n-channel MOSFET 118 having a source drain and gate. The drain of the MOSFET 118 is coupled to the output of the second inverter on line 21. The source of the MOSFET 118 is connected to node 15a. The gate of the MOSFET 118 is coupled to clock signal (clkb). The function of the first application switch 18 is to couple the voltage provided by the first pre-amplifier element 20 to the input (node 41) of the first inverter 22 at a regular interval.

The second application switch 28, is used to couple the voltage provided by the second pre-amplifier element 30 to the input (node 42) of the second inverter 24. The second application switch 28 is comprised of an n-channel MOSFET 128 having a source drain and gate. The drain of the MOSFET 128 is coupled to the output of the first inverter 22 on line 23. The drain of the MOSFET 128 is coupled to node 25a, which corresponds to a junction point of the second resistive element 27 and second capacitive element 29. The gate of the MOSFET 128 is coupled to the second clock signal (clkb) that is used to control the on period and the off period of the MOSFET 118 (i.e., first application switch 18). Thus, the first application switch 18 and the second application switch 28 have the same duty cycle.

A current source 32 (FIG. 1), coupled to the base of the comparator 10, provides a constant level of current to the comparator 10. The current source 32 is comprised, in part, of a current mirror consisting of a first n-channel MOSFET 132a having a source, drain and gate and a second n-channel MOSFET 132b also having a source, drain and gate. The gates of the corresponding current mirror transistors 132a, 132b are connected together at a node 133. The respective sources of the current mirror transistors 132a, 132b are coupled to ground at node 135. The drain of MOSFET 132a is coupled to the sources of the first and second input transistors 12, 14, respectively through a first bias switch 16 and a second bias switch 26. The structure of the first and second bias switches will be described in greater detail below. The drain and gate of the MOSFET 132b are connected together. Thus, the inter-connected drain and gate of MOSFET 132b are also coupled to the gate of the MOSFET 132a at node 133. The drain of the MOSFET 132b is also coupled to a reference bias current source (ibias) at node 140. Also coupled to node 133 is a third n-channel MOSFET 142, which acts as a power down circuit for the comparator. The MOSFET 142 has a source drain and gate. The drain of the MOSFET 142 is coupled to node 133. The source of the MOSFET 142 is coupled to ground at node 135 and the gate of the MOSFET 142 is coupled to an external power down signal PD. The current source 32 also includes a band gap circuit 143, consisting of a plurality of parallel connected n-channel MOSFETS all coupled to node 135.

The current source of the present invention also includes an additional sink current source 50, which is coupled to the drain of transistor 132a, through a corresponding sink current application switch 52. The sink current source 50 is comprised of a p-channel MOSFET 150, having a corresponding source drain and gate. The source of the sink current MOSFET 150 is coupled to $V_{DD}$. The drain of the sink current MOSFET 150 is coupled to the drain of the corresponding sink current application switch 52. In addition, the drain of the sink current MOSFET 150 is also coupled to its gate. The source of the sink current application switch 52 is also coupled to the respective sources of the first and second bias transistors 16 and 26, respectively. The gate of the sink current application switch 52 is coupled to second clock signal (clkb); therefore, the on and off periods of the sink current application transistor 52, is the same as those of the first and second application MOSFETS 118 and 128 and switch 25. Thus, the sink current source 50 provides the bias current to the current source 32 during those operating periods when current source 32 is removed from the system by bias transistors 16, 26.

In an exemplary embodiment, the first bias transistor 16 and the second bias transistor 26 have substantially identical structures and modes of operation; therefore, only the structure of the first bias transistor 16 will be described hereinafter. As illustrated in FIG. 2, the first bias transistor 16 is comprised of an n-channel MOSFET having a source, drain and gate. The drain of the first bias transistor 16 is coupled to the source of first input transistor 12. The source of the first bias transistor 16 is coupled to the drain of MOSFET 132a at common node 136. The gate of the first bias transistor 16 is coupled to the gate of the second bias transistor 26 and also to clock signal (clk). The duty cycle of the clock signal (clk) is complementary to the second clock signal (clkb). Thus, when the first and second bias switches 16 and 26 are closed, the first and second application switches 18, 26, switch 25 and the sink current application switch 52 are all open. Consequently, the bias switches and corresponding application switches have complementary duty cycles.

The inputs to be compared are provided to the comparator of the present invention 10 by a first input transistor 12 and a second input transistor 14. The first input transistor 12 is comprised of an n-channel MOSFET having a drain, source and gate. The drain of the first input transistor 12 is coupled to the source of the first application transistor 118 at node 15a. The source of the first input transistor 12 is coupled to the drain of the first bias transistor 16. The gate of the first input transistor 12 is coupled to the negative input of the comparator ($V_{INN}$). The second input to the comparator 10 is provided by a second input transistor 14 comprising an n-channel MOSFET having a drain, source and gate. The drain of the second input transistor 14 is coupled to the source of the second application transistor 128. The source of the second input transistor 14 is coupled to the drain of the second bias transistor 26. The gate of the second input transistor 12 is coupled to the positive input of the comparator ($V_{INP}$).

Figure 3:
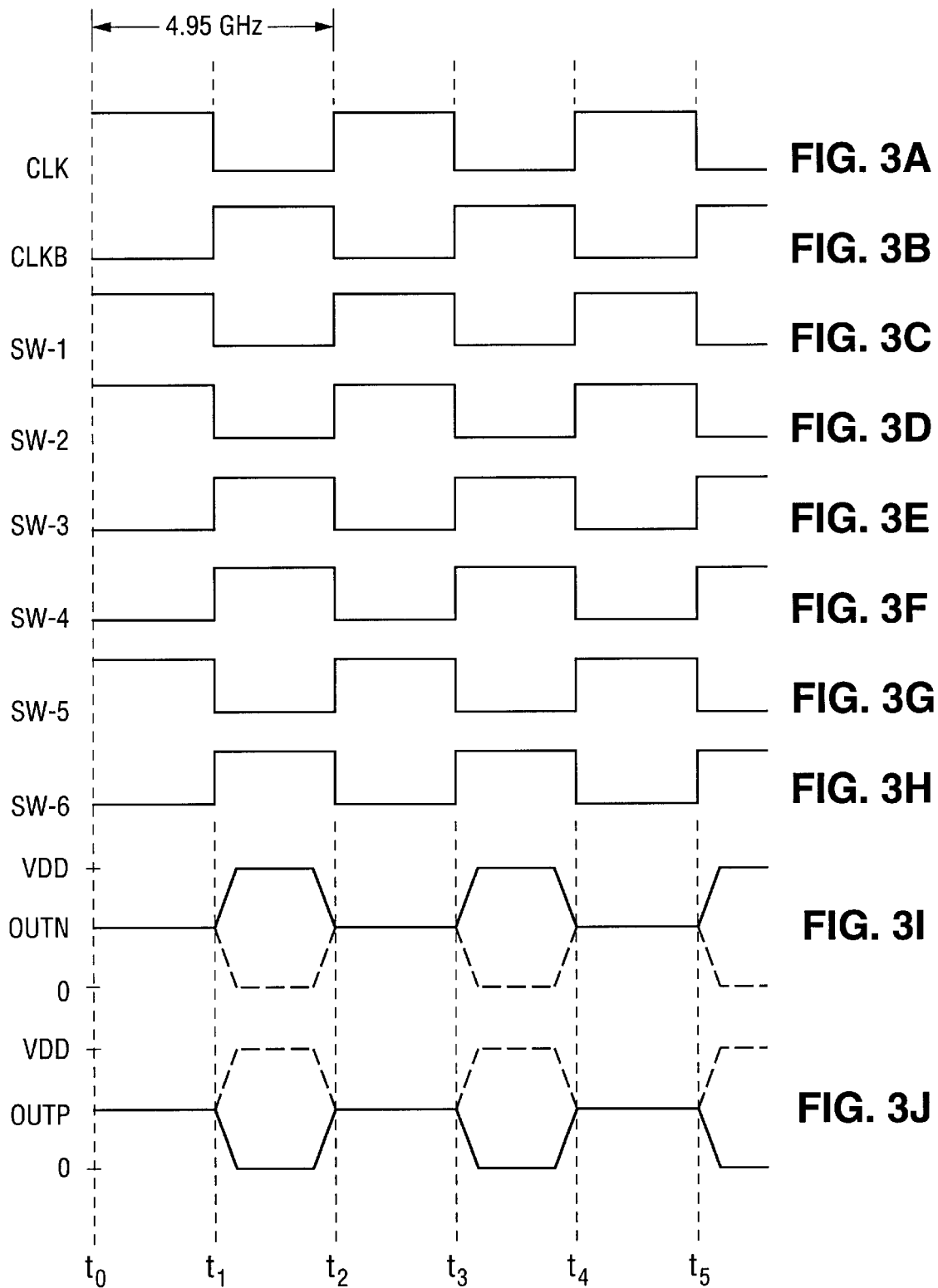
FIGS. 3(A)–3(J) are timing diagrams illustrating the operation of the comparator illustrated in FIGS. 1 and 2.

The operation of the comparator 10 will now be described with reference to FIGS. 3A–3J. FIGS. 3A–3J are timing diagrams illustrating the operation of the comparator 10. As illustrated in FIG. 3, the clock signals clk and clkb, that control the operation of the comparator, are complementary in nature. Thus, when the main clock signal (clk) is high, the second secondary clock signal (clkb), which controls the "on" and "off" periods of the application MOSFETS 118, 128, sink current application switch 52 and the switch 25 is low. In application, the comparator has two operating modes: (1) a standby mode, where the outputs of the comparator are maintained substantially at a predetermined voltage level; and (2) a comparison mode, where the outputs of the comparator reflect the relative difference between the signals (i.e. voltages) provided at the inputs of the comparator at $V_{INN}$ and $V_{INP}$, respectively.

In the standby mode, for example during time interval t0–t1, clk (FIG. 3A) is high. This results in the first bias transistor 16 (FIG. 3C) and the second bias transistor 26 (FIG. 3D) being closed (i.e., on), wherein the bias current provided by the current source 32 is supplied to the comparator. In addition, the switch 25 (FIG. 3G) is also closed. During this period, the corresponding outputs OUTN (FIG. 3I) and OUTP (FIG. 3J) of the comparator 10 are pulled to about one-half the maximum output voltage level as the corresponding input nodes 15a and 25a are charged to a suitable level by the bias current flowing through the first and second bias transistors. More specifically, in an exemplary embodiment, when the first and second bias transistors are both on (i.e. conducting), the voltage at the output(s) of the comparator 10 is maintained at about 0.5 $V_{DD}$.

In the comparison mode, for example during time interval t1–t2, clk is low; thus, clkb (FIG. 3B) is high. This causes the first bias MOSFET 16, the second bias MOSFET 26 and the switch 25 to become open (i.e. non-conducting). During the comparison mode, the first application switch 18 (FIG. 3E), the second application switch 28 (FIG. 3F) and the sink current application switch 52 (FIG. 3H) are all closed (i.e. conducting). This causes the two input nodes 15a and 25a, respectively, to be applied to the outputs of the inverters 22, 24, and the output(s) of the comparator no longer being actively clamped at 0.5 $V_{DD}$. During the comparison mode, the output(s) of the comparator represent the relative difference between the voltages present at inputs $V_{INN}$ and $V_{INP}$, respectively. For example, if the input voltage ($V_{INP}$) present or applied at node 15a is greater than the input voltage ($V_{INP}$) present or applied at node 25a, the voltage present at the corresponding output of inverter 22 (signal on pin 123p) will be greater than the voltage present at the output of inverter 24 (i.e. signal on pin 121p). Correspondingly, if the input voltage ($V_{INP}$) present or applied at node 25a is greater than the input voltage ($V_{INN}$) present or applied at node 15a, the voltage present at the corresponding output of inverter 22 (i.e. signal at pin 123p) will be less than the voltage present at the output of the inverter 24 (i.e. signal at pin 121p). In operation, this voltage comparison is completed at substantially the same rate as the clock frequency; thus, the comparator can operate at frequencies of about 5.0 GHz.

During a subsequent standby mode (i.e. time interval t2–t3), the respective output(s) of the comparator 10 are once again pulled to about 0.5 $V_{DD}$, wherein the comparator awaits new inputs being provided to the input transistors 12 and 14, respectively to be compared. By maintaining the output level of the comparator 10 at substantially the middle of the maximum voltage swing during the standby mode, the amount of time required to perform a subsequent comparison operation (i.e. switching from an idle state to a comparison state) is minimized. In fact, in an exemplary embodiment of the present invention, by maintaining the output level of the comparator during the standby mode to about 0.5 $V_{DD}$, the comparator can operate at speeds in excess of about 5.0 GHz. Thus, the comparator of the present invention can be used in devices capable of handling digital switching operations. In particular, the comparator 10 can be used in conjunction with TMDS receivers operating in conformance with the DVI standard.

Figure 4:
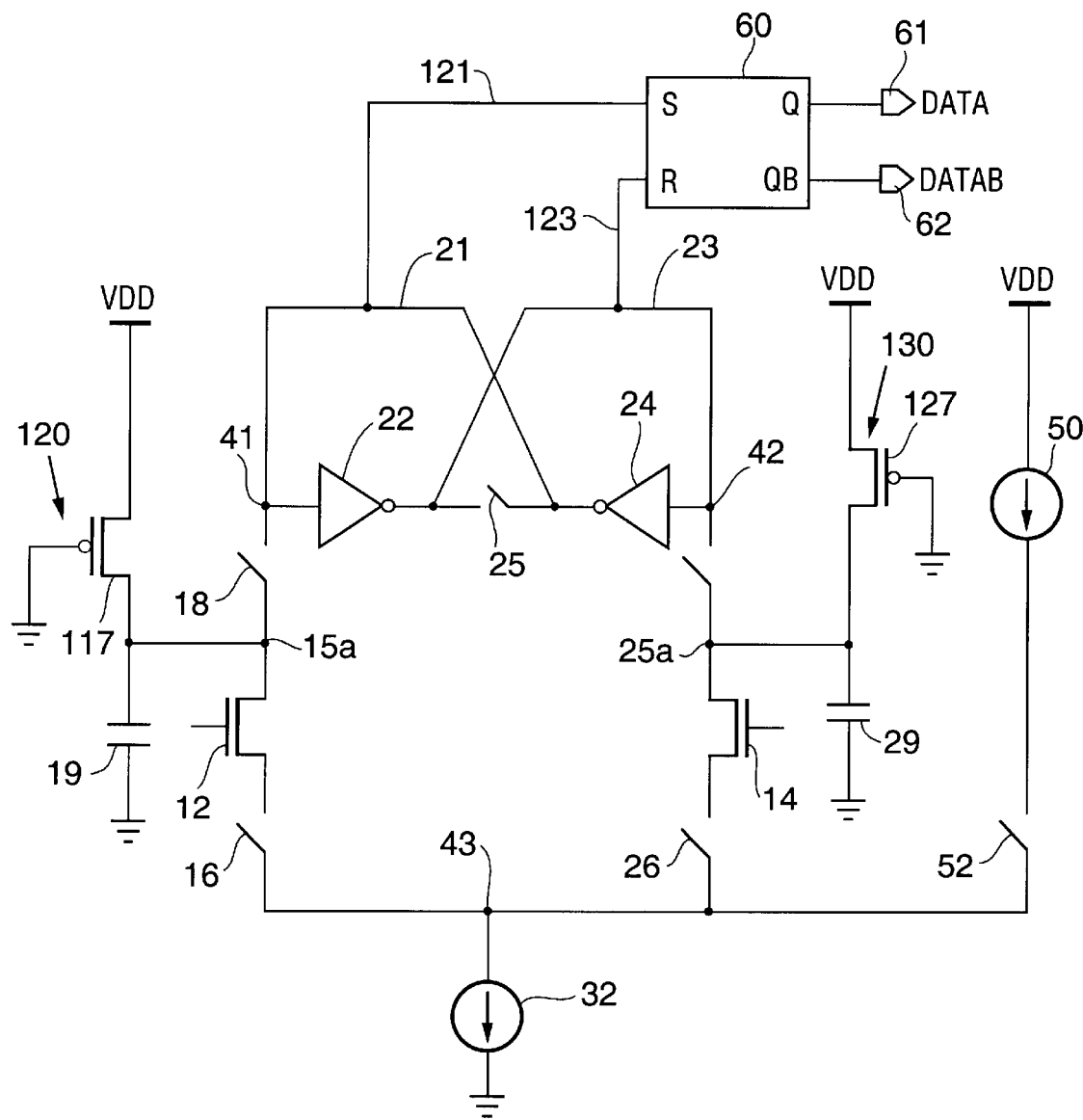
FIG. 4 is a block diagram of the comparator being used in a transition-minimized differential signal receiver according to an exemplary embodiment of the present invention.

FIG. 4 is a block diagram of the comparator 10 being used in combination with a set-reset flip flop 60 to implement the operation of a transition-minimized differential-signaling receiver according to an exemplary embodiment of the present invention. The set-reset flip flop is used to prevent undefined output voltage levels from negatively affecting comparator operation or performance when switching between the standby and comparison modes. As illustrated in FIG. 4, a first (i.e., negative) output (OUTN) of the comparator is provided to the reset pin (R) of the set-reset flip flop 60 on line 123. In corresponding fashion, the second (i.e., positive) output (OUTP) of the comparator is provided to the set pin (S) of the set-reset flip flop 60 via line 121. The output (Q) of the set-reset flip flop 60 is provided at pin 61, while an inverted version of the output (Q) is provided on line 62. The set-reset flip flop 60 of the present invention operates as illustrated in Table 1 below.

TABLE 1

| S | R | Q | $\overline{Q}$ | MODE |
|---|---|---|---|---|
| 0 | 0 | 0 | 0 | Avoid |
| 0 | 1 | 0 | 1 | Normal Operation |
| 1 | 0 | 1 | 0 | Normal Operation |
| 1 | 1 | Q | $\overline{Q}$ | Data Unchanged |

As discussed above in greater detail with respect to FIGS. 1–3, the comparator 10 can operate at speeds of about 5.0 GHz; therefore, the output provided by the set-reset flip flop 60 can also be provided at speeds upwards to about 5.0 GHz. Therefore, a TMDS receiver incorporating the comparator of the present invention can be used in conjunction with any type of suitable display device operating in accordance with, for example, the DVI standard. In addition, by having a 0.35 µm form layout the comparator 10 of the present invention can be used in many other types of devices, including flat panel display devices.

Figure 5A:
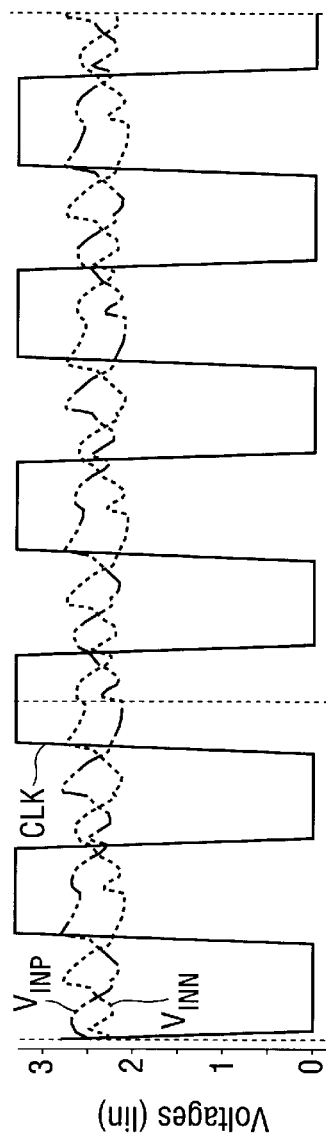
FIGS. 5(A)–5(C) are waveforms illustrating the output of the comparator illustrated in FIGS. 1 and 2 and 4.
Figure 5B:
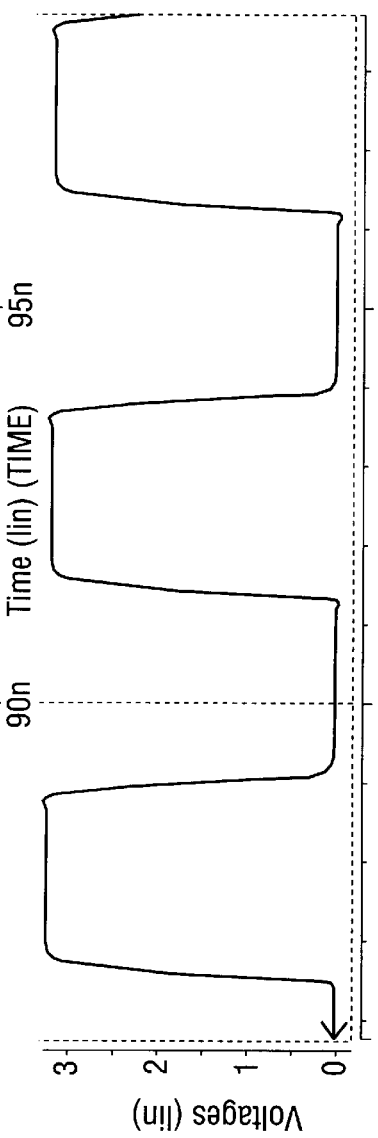

The improved operating characteristics of the comparator 10 of the present invention will now be discussed with reference to FIGS. 5A–5C. FIG. 5A is a plot of voltage versus time illustrating the set up period of the comparator 10 during one operating condition. For purposes of example, assume the voltage present at the positive input ($V_{INP}$) of the comparator 10 is greater than the voltage present at the negative input ($V_{INN}$) of the comparator. In this situation, node 25a charges to a higher level than corresponding node 15a. In other words, the magnitude of the voltage present at node 25a is greater than the magnitude of the voltage present at node 15a. When the comparator enters its next comparison mode (i.e. clock signal being transmitted to the application transistors 118 and 128), the difference between the voltage present at nodes 15a and 25a will be provided as the output of the comparator 10 on line 121 (FIG. 5B). This signal is then transmitted to the flip-flop 60 (FIG. 4).

Figure 5C:
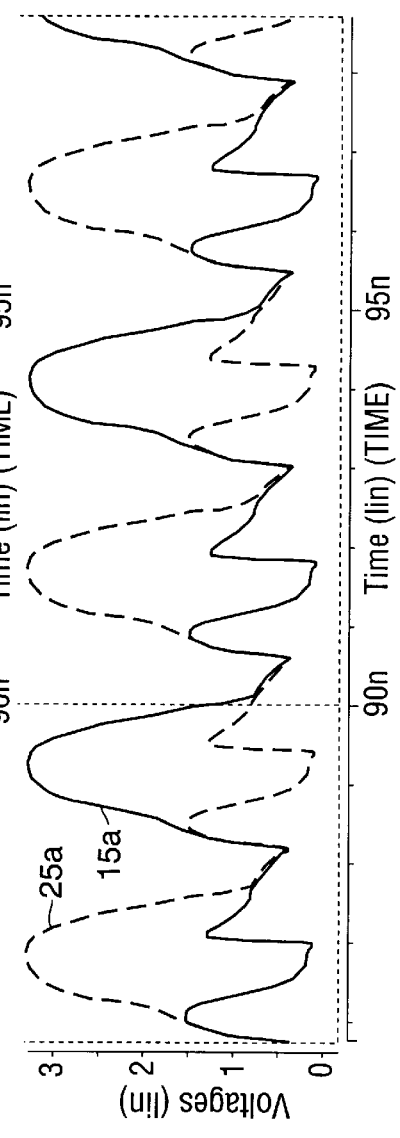

Correspondingly, as illustrated in FIG. 5C, when $V_{INN}$ is greater in magnitude with respect to $V_{INP}$, the charge present at node 15a is greater than the magnitude of the charge present at node 25a. In this situation, the flip-flop 60 will receive the output of the comparator on line 123 (FIG. 4) during the next falling edge of the clk. This represents the next comparison mode of the comparator.

As illustrated in FIG. 5A, the differential input signal provided to the comparator is very small. Consequently, shifting from the standby mode to the comparison mode is performed very quickly.

The above detailed description of the present invention has been provided for the purposed of illustration and description. Although the present invention has been described with respect to several specific embodiments, various changes and modifications may be suggested to persons of ordinary skill in the art, and it is intended that the present invention encompass such changes and modifications that fall within the scope of the claims appended hereto.

What is claimed is:

1. A comparator circuit comprising:

a pair of cross-coupled inverters having a pair of outputs;

a pair of input transistors, each having a gate for receiving an input voltage signal, and a source and drain;

means, responsive to a first signal, for connecting together the outputs of the cross-coupled inverters so that the inverter outputs have a nearly equal voltage and for supplying a bias current to the input transistors so as to charge the drains of the input transistors based on input voltage signals present at the gates of the input transistors;

means, responsive to a second signal, for applying the charged drains of the input transistors to the outputs of the cross-coupled inverters to establish, on the outputs of the cross-coupled inverters, a voltage difference representative of a voltage difference at the inputs and for supplying a source current, from a supply voltage, to the bias current means; and means for establishing an RC time-constant at the drains of the input transistors.

2. A comparator circuit as recited in claim 1, wherein the inverter outputs are set at approximately half of the supply voltage when connected together.

3. A comparator circuit as recited in claim 1, wherein the first signal is a first clock and the second signal is a second clock; and wherein the first clock is active while the second clock is inactive and the second clock is active while the first clock is inactive.

4. A comparator circuit as recited in claim 1, wherein the first signal is a first clock and the second signal is a second clock; and wherein the first clock and second clock have a frequency of about 5 gigahertz.

5. A comparator circuit as recited in claim 1, wherein the first signal is active during a standby period and the second signal is active during a comparison period.

6. A comparator circuit comprising:

a pair of cross-coupled inverters having a pair of outputs;

means, responsive to a first signal, for connecting together the outputs of the cross-coupled inverters, the outputs of the cross-coupled inverters being outputs of the comparator circuit;

a pair of input transistors, each having a gate for receiving an input signal, and a source and drain;

means for sinking current from a common node to a first supply voltage;

means, responsive to the first signal, for connecting the common node to the sources of the input transistors;

means, responsive to a second signal, for connecting the drains of the input transistors to a respective one of the outputs of the cross-coupled inverters;

a pair of RC-elements, each having a junction node connected, respectively, to the drains of the input transistors;

means for sourcing current from a second supply voltage to a source node; and means, responsive to the second signal, for connecting the source node to the common node.

7. A comparator circuit as recited in claim 6, wherein the means for connecting the inverter outputs is a bidirectional transmission gate.

8. A comparator circuit as recited in claim 6, wherein the means for connecting the inverter outputs causes the inverter outputs to have the substantially the same voltage when the first clock signal is active.

9. A comparator circuit as recited in claim 6, wherein the means for sinking current includes a current mirror circuit having an input for receiving a reference current.

10. A comparator circuit as recited in claim 9, wherein the current mirror includes means, responsive to a power down signal, for shutting off the current mirror.

11. A comparator circuit as recited in claim 6, wherein the means for connecting the common node to the input transistor sources includes a pair of n-channel transistors each having a gate, source and drain, the sources of the n-channel transistors being connected to the common node, the drains of the n-channel transistors being connected, respectively, to the sources of the input transistors, and the gates of the n-channel transistors being operative to form a conduction path between the respective sources and drains in response to the first clock signal.

12. A comparator circuit as recited in claim 6, wherein the means for connecting the input transistor drains to the inverter outputs includes a pair of n-channel transistors, each having a gate, source and drain, the sources of the n-channel transistors being connected, respectively, to the drains of the input transistors, the drains of the n-channel transistors being connected, respectively, to the inverter outputs, the gates of the n-channel transistors being operative to form a conduction path between the respective sources and drains in response to a second clock signal.

13. A comparator circuit as recited in claim 6, wherein the means for sourcing current from a second supply voltage to a source node includes a diode-connected p-channel transistor having a drain and a source, the drain connected to the second supply voltage and the source connected to the source node.

14. A comparator circuit as recited in claim 6, wherein the means for connecting the source node to the common node includes a n-channel transistor having a gate, source and drain, the source connected to the common node, the drain connected to the source node, and the gate being operative to form a conduction path between the source and drain in response to the second clock signal.

15. A comparator circuit as recited in claim 6, wherein the first and second clock signals are complementary.

16. A comparator circuit comprising:

first and second inverters, the first inverter having an output connected to an input of the second inverter, the second inverter having an output connected to an input of the first inverter, the outputs of the first and second inverters being the outputs of the comparator circuit;

a transmission gate connected between the outputs the inverters and having a first control input for receiving a first clock signal and a second control input for receiving a second clock signal;

first and second input transistors, each having a gate, source and drain, the gate of the first transistor for receiving a first input signal, the gate of the second transistor for receiving a second input signal;

a first current source configured to sink current from a common node to the first supply voltage;

first and second bias switches, the first bias switch connected between the source of the first input transistor and the common node, the second bias switch connected between the source of the second input transistor and the common node, the first and second bias switches each having a control input for receiving the first clock signal;

first and second application switches, the first application switch connected between the drain of the first input transistor and the output of the second inverter, the second application switch connected between drain of the second input transistor and the output of the first inverter, the first and second application switches each having a control input for receiving the second clock signal;

first and second RC-elements, each including a capacitive element present between a first supply voltage and a junction node and a resistive element connected between a second supply voltage and the junction node, each junction node connected respectively to the drains of the input transistors;

a second current source configured to source current to an output from the second supply voltage;

a third application switch connected between the output of the second current source and the common node, and having a control input for receiving the second clock signal.

17. A comparator as recited in claim 16, wherein the resistive element of the first and second RC-elements is a p-channel transistor having a gate connected to the first supply voltage, a source connected to the second supply voltage and a drain connected to the corresponding junction node.

18. A comparator as recited in claim 17, wherein the capacitive elements of the first and second RC-elements include a parasitic capacitance and a capacitance between the gate and source of the p-channel transistors of the RC-elements.

19. A comparator as recited in claim 17, wherein the capacitive elements of the first and second RC-elements are dedicated capacitors.

20. A comparator as recited in claim 16, wherein the transmission gate includes an n-channel and a p-channel transistor, each having a gate, a source and a drain, a channel being formable between the source and drain of each transistor, the channels of the n-channel and p-channel transistors being connected in parallel, and the gate of the n-channel transistor being connected to the first control input, the gate of the p-channel transistor being connected to the second control input.

21. A comparator as recited in claim 16, wherein the first and second bias switches are each n-channel transistors, each transistor having a gate connected to a control input.

22. A comparator as recited in claim 16, wherein the first and second application switches are each n-channel transistors, each transistor having a gate connected to a control input.

23. A comparator as recited in claim 16, wherein the third application transistor is an n-channel transistor having a gate connected to the control input.

24. A comparator as recited in claim 16, wherein the first current source includes a current mirror circuit having an input for receiving a reference current, the current mirror establishing a predetermined current between the common node and ground based on the reference current.

25. A comparator as recited in claim 16, wherein the second current source includes a p-channel transistor having a gate, source and drain, the drain being connected to the gate to form a diode-connected transistor, the source for connecting to the second supply node, the drain being the output of the second current source.

26. A comparator as recited in claim 16, wherein the first and second inverters each include a p-channel transistor and an n-channel transistor, each having a gate, source and drain, the gates of the p-channel and n-channel transistor being connected to each other, the drains of the p-channel and n-channel transistor being connected to each other, the source of the n-channel transistor being connected to the first supply voltage, and the source of the p-channel transistor being connected to the second supply voltage.

27. A comparator as recited in claim 26, wherein the n-channel and p-channel transistors of each inverter have a channel length of approximately 0.4 micrometers and a width of approximately 4 micrometers.

28. A comparator as recited in claim 26, wherein the n-channel and p-channel transistors of each inverter have a width to length ratio of about 10.

* * * * *

UNITED STATES PATENT AND TRADEMARK OFFICE
CERTIFICATE OF CORRECTION

PATENT NO.    : 6,535,029 B2                                                    Page 1 of 1
DATED         : March 18, 2003
INVENTOR(S)   : Shou-Po Shih et al.

It is certified that error appears in the above-identified patent and that said Letters Patent is hereby corrected as shown below:

<u>Column 9,</u>
Lines 41, 64 and 66, "clock" should be deleted.
Line 51, "a second clock" should be deleted and replaced with -- the second --.

<u>Column 12,</u>
Line 1, "node" should be deleted and replaced with -- voltage --.

Signed and Sealed this

Twenty-second Day of July, 2003

JAMES E. ROGAN
*Director of the United States Patent and Trademark Office*